(12) United States Patent
Lüdeke et al.

(10) Patent No.: US 6,397,094 B1
(45) Date of Patent: May 28, 2002

(54) MR METHOD UTILIZING MICROCOILS SITUATED IN THE EXAMINATION ZONE

(75) Inventors: Kai-Michael Lüdeke; Volker Rasche, both of Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/227,465

(22) Filed: Jan. 8, 1999

(30) Foreign Application Priority Data

Jan. 9, 1998 (DE) ........................................ 198 00 471

(51) Int. Cl.⁷ .............................................. A61B 5/055
(52) U.S. Cl. ..................... 600/411; 600/423; 324/309
(58) Field of Search ................................ 600/411, 412, 600/419, 420, 423, 424; 324/306, 318, 309; 120/899

(56) References Cited

U.S. PATENT DOCUMENTS

| | | | |
|---|---|---|---|
| 5,769,843 A | * | 6/1998 | Abela et al. |
| 5,916,162 A | * | 6/1999 | Snelton et al. ............... 600/411 |
| 5,951,472 A | * | 9/1999 | Van Vaals et al. |
| 5,964,705 A | * | 10/1999 | Truwit et al. |
| 6,023,636 A | * | 2/2000 | Wendt et al. |
| 6,087,831 A | * | 7/2000 | Bornert et al. |
| 6,201,987 B1 | * | 3/2001 | Dumoulin ................... 600/424 |
| 6,203,493 B1 | * | 3/2001 | Ben-Haim ................... 600/117 |
| 6,242,915 B1 | * | 6/2001 | Hurd .......................... 324/309 |
| 6,275,722 B1 | * | 8/2001 | Martin et al. ............... 600/410 |
| 6,280,385 B1 | * | 8/2001 | Meizer et al. .............. 600/423 |

FOREIGN PATENT DOCUMENTS

| | | | |
|---|---|---|---|
| DE | 19543785 | 5/1997 | ......... G01R/33/563 |
| EP | 0768539 A2 | 4/1997 | ........... G01R/33/28 |

OTHER PUBLICATIONS

"Small Tuned Fiducial Markers Designed to give Substantial MR Signals with Minim Perturbation of Body Magnetization" by M. Burl et al. SMR 95.

* cited by examiner

*Primary Examiner*—Marvin M. Lateef
*Assistant Examiner*—Shawna J Shaw
(74) *Attorney, Agent, or Firm*—John Vodopia

(57) ABSTRACT

The invention relates to an MR method which utilizes a microcoil without connection leads which causes an increase of or a change in phase of an external RF magnetic field in its direct vicinity within an object to be examined. This increase can be used to localize the coil, to image the direct vicinity, or to track the propagation of a liquid flow passing through the direct vicinity.

9 Claims, 2 Drawing Sheets

MR METHOD UTILIZING MICROCOILS SITUATED IN THE EXAMINATION ZONE

BACKGROUND OF THE INVENTION

1. Field of the Invention

The invention relates to an MR method in which the nuclear magnetization in an object to be examined and present in an examination zone is excited by at least one magnetic RF pulse, in which the MR signals subsequently received by an MR coil are used to form at least one MR image, and in which at least one microcoil, tuned to the MR frequency, is introduced into the object to be examined. The invention also relates to an MR device for carrying out this method.

2. Description of Related Art

A method and a device of this kind are known from Application Ser. No. 08/754,360. Therein, the microcoil ifs connected to a receiver. The position of the microcoil can be determined from the MR signals received thereby after the excitation by an RF pulse; for example, this position can be superposed on an image formed by means of another MR coil. However, this method involves the risk that the high frequency pulses induce voltages in the connection leads which connect the microcoil present in the object to be examined to the MR receiver, which voltage may cause burning of said object in the vicinity of the connection leads. This risk cannot be eliminated by detuning or deactivating the microcoil during the RF pulse, as is customary for these methods.

SUMMARY OF THE INVENTION

It is an object of the present invention to provide a method of the kind set forth in which the described overheating can be avoided. Moreover, the method should be suitable for a larger variety of applications.

This object is achieved according to the invention in that use is made of a microcoil without connection leads and that the MR signals are processed in such a manner that the local variation, induced by the microcoil, of the magnetic field which occurs in the object to be examined due to the RF pulses becomes visible in the MR image.

The invention utilizes the fact that the magnetic field associated with the RF pulses is increased in the direct vicinity of the microcoil (being the area enclosed by the microcoil and the area outside the microcoil in which essentially the magnetic field of the coil is concentrated). Therefore, the nuclear magnetization in the area of the microcoil is influenced to a different extent in comparison with the remainder of the examination zone, and this phenomenon can be made visible in an MR image. Because of the absence of the connection leads, in contrast with the previously mentioned device the MR signals induced into the microcoil cannot be conducted to the MR receiver. Whereas the microcoil of the known device thus is operative only in the receiving phase, the microcoil according to the invention operates only in the transmission phase.

It is to be noted that an article by M. Burl et al., SMR 95, already discloses a "fiducial marker" which consists of a microcoil and a sample holder which is situated inside the coil and contains water doped with Gd-DTPA. Because of this doping, a very short $T_1$ relaxation time occurs. These markers are used, for example as reference points for frameless stereotaxy.

In contrast therewith, the microcoil according to the invention is used only within the object to be examined, i.e. without a sample holder; it interacts exclusively with substances or structures of the object to be examined.

A preferred further version is based on the recognition of the fact that in its direct vicinity the microcoil not only varies the amplitude of the magnetic field but also the phase thereof. In the case of a very small Q, for which the increase of the magnetic field can hardly be demonstrated in the MR image, substantial phase variations which become visible in the phase image can still occur.

A further version enables improved identification of the macrocoil. A simple microcoil produces a local increase of the magnetic field which could be hardly noticeable in an MR image, particularly if the microcoil is very small. In the coil segments of different orientation, for example of different winding direction, however, deviating phase positions, and possibly amplitudes, of the magnetic field occur which can be readily observed as a characteristic pattern in an MR image.

A first possible application of the method according to the inventions is to a medical instrument, for example a catheter.

An application of microcoils which was unknown thus far is an application for flux visualization, for example for visualizing the blood flow in blood vessels. For example, when a microcoil is introduced into a blood vessel, the nuclear magnetization present within the microcoil at the instant of application of the excitation RF pulse is excited. This blood volume, however, moves together with the blood flow and, therefore, its position in the MR image is dependent on the temporal distance between the RF pulse and the reception of the MR signal or signals wherefrom the MR image is derived. This embodiment, therefore, enables examination of the propagation of the blood volume.

In a further version the projection direction preferably extends perpendicularly to the flow direction, and represents a very fast examination method.

A further possible application again utilizes the fact that the magnetic field is increased essentially only within the microcoil. When the amplitude of the RF pulses is suitably chosen, only the area within the microcoil will experience an excitation which suffices for an MR image, so that the MR image can be limited to this small area; this results in short measuring times and also enables fluoroscopic applications.

A still further version defines the possibility of using the microcoil for hyperthermia for which it is advantageous that the necessary temperature measurement can also be performed in known by means of an MR method.

The invention also includes an MR device for carrying out the MR method.

BRIEF DESCRIPTION OF THE DRAWINGS

The invention will be described in detail hereinafter with reference to the drawings. Therein.

DETAILED DESCRIPTION OF THE PREFERRED EMBODIMENT

Figure 1:
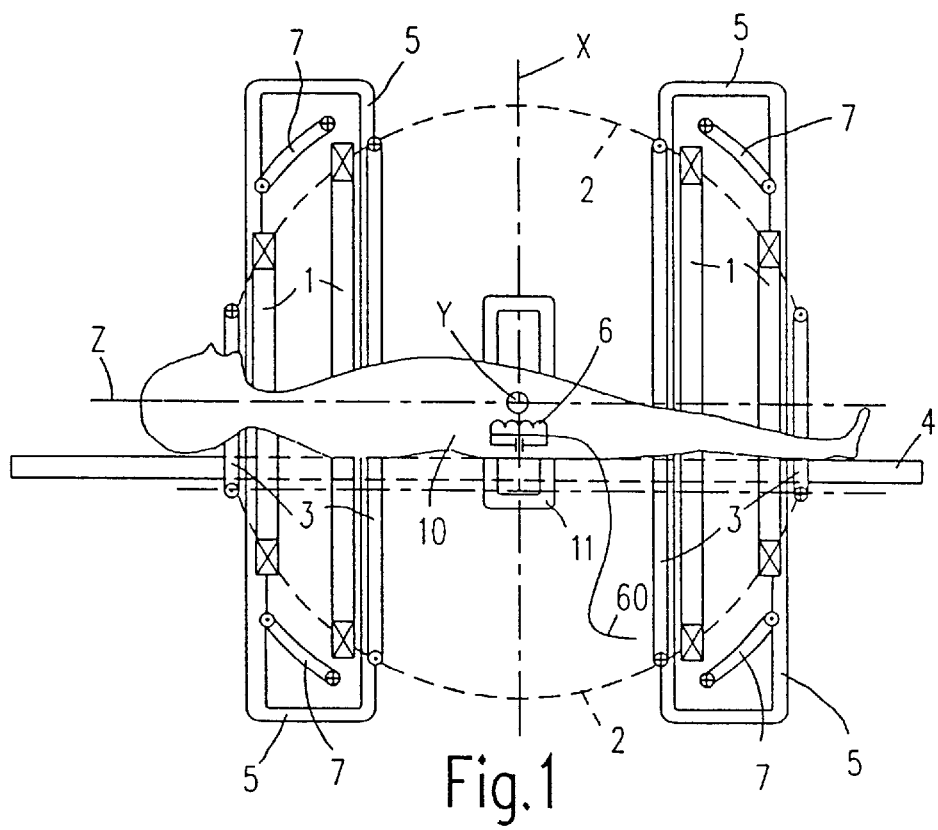
FIG. 1 is a simplified representation of an MR apparatus in which a microcoil is used.

The MR apparatus as diagrammatically shown in FIG. 1 includes a system of four coils 1 for generating a uniform, steady magnetic field whose strength may be in the range of from some tenths of T to some T. The coils, being situated concentrically with the z axis, may be provided on a spherical surface 2. An object to be examined, for example a patient 10, is arranged on a table top 4 which is positioned within said coils. A catheter 60, provided with a microcoil 6 at its tip, is introduced into the patient.

Four coils 3 are arranged on the spherical surface 2, or on a cylindrical surface, in order to generate a magnetic field which extends in the z direction and varies linearly in this direction. Also provided are four coils 7 which generate a magnetic gradient field (i.e. a magnetic field whose strength varies linearly in one direction) which also extends in the z direction, but whose gradient extends in the x direction (vertically). A magnetic gradient field which extends in the z direction and has a gradient in the y direction (perpendicular to the plane of drawing of FIG. 1) is generated by four coils 5 which may be identical to the coils 7 but are arranged so as to be offset 90° in space with respect thereto. Only two of these four coils are shown in FIG. 1. The field strength at the center of the sphere is determined exclusively by the steady uniform magnetic field of the coil system 1.

Figure 2:
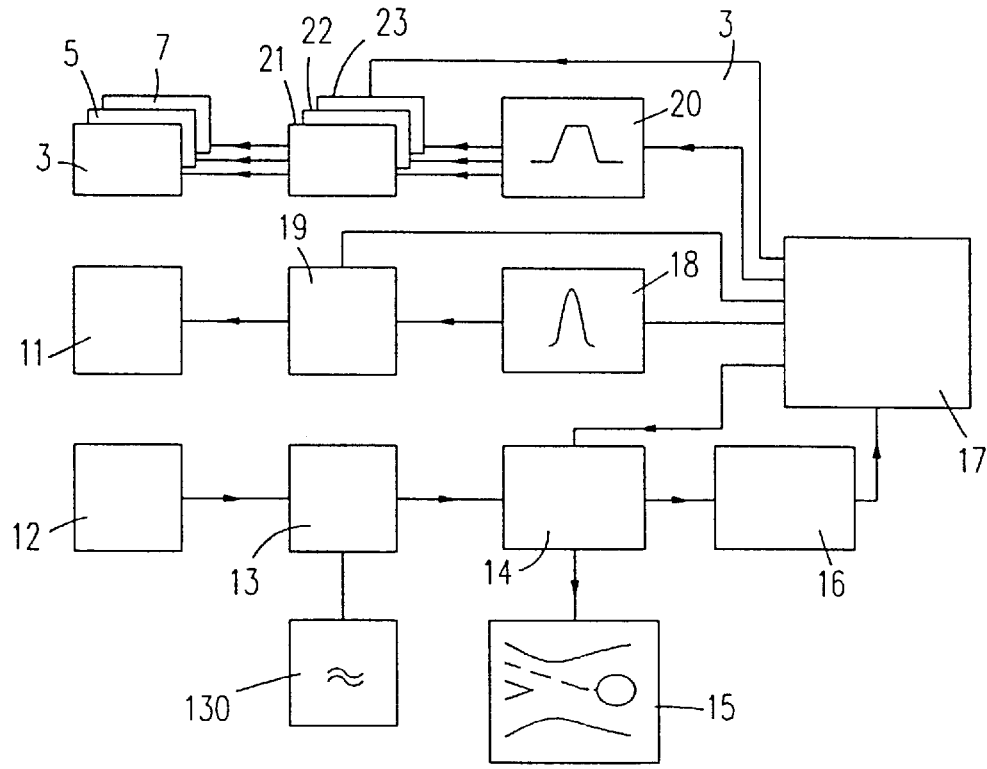
FIG. 2 shows the circuit diagram of such an apparatus.

In conformity with FIG. 2, the temporal variation of the magnetic gradient fields generated by the gradient coils 3, 5 and 7 is determined by a gradient waveform generator 20 which is controlled by a control unit 17. The waveform imposed by the generator 20 is applied to at least one of the gradient amplifiers 21, 22 and 23 which supply the current for the gradient coils 3, 5 and 7. The gain factors of the gradient amplifiers 21, 22 and 23 can be adjusted independently of one another by the control unit 17.

There is also provided an RF transmitter coil 11 which generates, in a pulsed manner, an RF, spatially substantially uniform magnetic field which extends perpendicularly to the direction of the steady uniform magnetic field (i.e. perpendicularly to the z direction). The central frequency and the envelope of the RF pulses generated by the coil 11 are imposed by a generator 18 (FIG. 2) which is also controlled by the control unit 17. The control unit 17 also controls the gain of an amplifier 19 via which the RF signal supplied by the generator 18 is applied to the RF transmitter coil 11.

The RF transmitter coil 11 could also serve for the reception of the resonance signals generated in the examination zone. Preferably, however, a separate RF receiving coil, denoted by the reference 12 in FIG. 2, is used for this purpose. The MR signals received by said RF receiving coil are demodulated in a quadrature demodulator 13 by mixing with two 90° offset carrier oscillations (having the Larmor frequency or MR frequency determined by the strength of the steady magnetic field) of an oscillator 130, so that two signals are generated which can be considered as the real component aid the imaginary component of a complex MR signal. These signals are applied to an analog-to-digital converter 14 which forms MR data therefrom. Using the MR data, an image processing unit 16 reconstructs MR images which represent the nuclear magnetization in the examination zone. The MR images are displayed on a monitor 15.

Figure 3:
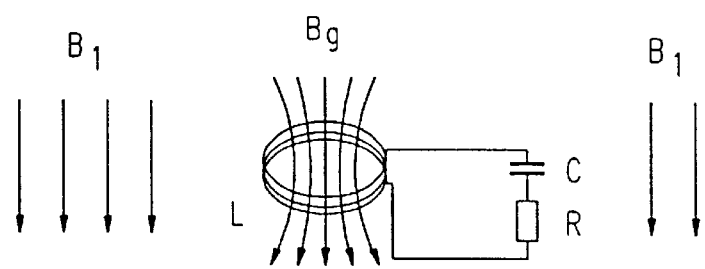
FIG. 3 shows the equivalent diagram of a microcoil.

FIG. 3 shows the equivalent diagram of the microcoil 6 of FIG. 1. The microcoil 6 comprises an inductance L whose shape and appearance are dependent on the relevant application, but is small in comparison with the RF transmitter coil 11 and generally small in comparison with the RF receiving coil 12. The inductance L is tuned to the MR frequency, i.e. to the central frequency of the RF pulses generated by the RF transmitter coil 11, by a capacitor C.

The resistance R embodies the losses occurring in the microcoil. The lower these losses are, the higher the quality factor Q of the coil will be.

In the examination zone the RF coil 11 causes a spatially uniform magnetic field (at least at the area of the microcoil) having the magnetic flux density $B_1$. Thus, in the resonant circuit formed by the elements L, C and R a current arises which itself generates a magnetic field which additionally traverses the coil and is superposed on the outer magnetic field of the RF coil. Inside the coil the overall magnetic field traversing the coil then has a spatial mean value of the flux density $B_g$ which satisfies:

$$B_g = B_1 \frac{Q+j}{j}, \text{ where } j = \sqrt{-1} \quad (1)$$

According to the equation (1), the flux density in the direct vicinity of the microcoil (or the magnetic flux through the microcoil) produced by an RF pulse having a flux density $B_1$ is the greater, the higher quality factor Q is. For high values of Q, $B_g$ is approximately the factor Q larger than $B_1$. This means that an RF pulse which hardly excites the nuclear magnetization at some distance from the coil 11 is capable of strongly exciting the nuclear magnetization within the coil and rotating it out of its rest state through, for example 90°. The image of the direct vicinity of the microcoil in the MR image thus clearly deviates from the image of the outer areas.

Equation (1) also demonstrates that a phase shift s exists between the (spatially averaged) flux density $B_g$ of the microcoil and the flux density $B_1$ caused by the RF transmitter coil 11, which phase shift approximately satisfies:

$\phi \approx -\arctan Q$

Thus, the phase shift $\phi$ amounts to almost 90° for high Q values.

The phase variation $\phi$ of the magnetic flux density $B_i$ near the microcoil can be reproduced by means of a phase image which represents the spatial phases of the nuclear magnetization. A very strong phase variation occurs at the area of the microcoil. In order to form such a phase image, the complex signal supplied by the quadrature demodulator 13 (FIG. 2) is subjected to a Fourier transformation in the image processing unit 16, thus yielding complex image values (with a real component and an imaginary component). For each pixel, the phase of the excited nuclear magnetization can be determined on the basis of the ratio of the real component to the imaginary component.

The RF coil which is diagrammatically shown in FIG. 3 realizes in its interior the increase of the magnetic flux density that follows from the equation 1. On the one hand this is desirable, but on the other hand it may have a disturbing effect if sequences for normal MR imaging act on the examination zone. Moreover, in the case of very small microcoils the area of increased magnetic flux density may be so small that it is hardly noticeable in a very noisy MR image.

Figure 4:
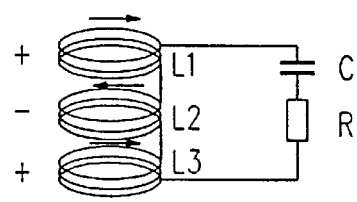
FIG. 4 shows the equivalent diagram of a modified microcoil.

Therefore, FIG. 4 shows an embodiment of a microcoil which, for a variety of applications, is more attractive than the microcoil of FIG. 3. It includes an inductance which consists, of three parts $L_1$, $L_2$ and $L_3$, the winding direction of the central part $L_2$ opposing that of the outer two parts $L_1$ and $L_3$. Because of this arrangement, the $B_1$ increase obtained amounts to only approximately one third of the increase that could be obtained in the case of coils of the same size which all have the same winding direction;

however, now a complex pattern with a phase of approximately −90° in the outer parts and just +90° in the central part, which can be readily recognized in an MR image, is now obtained. The subdivision into coil segments can also be extended in such a manner that only a slight $B_1$ increase is obtained but also a very suitably recognizable phase marking with high spatial frequencies.

Figure 5:
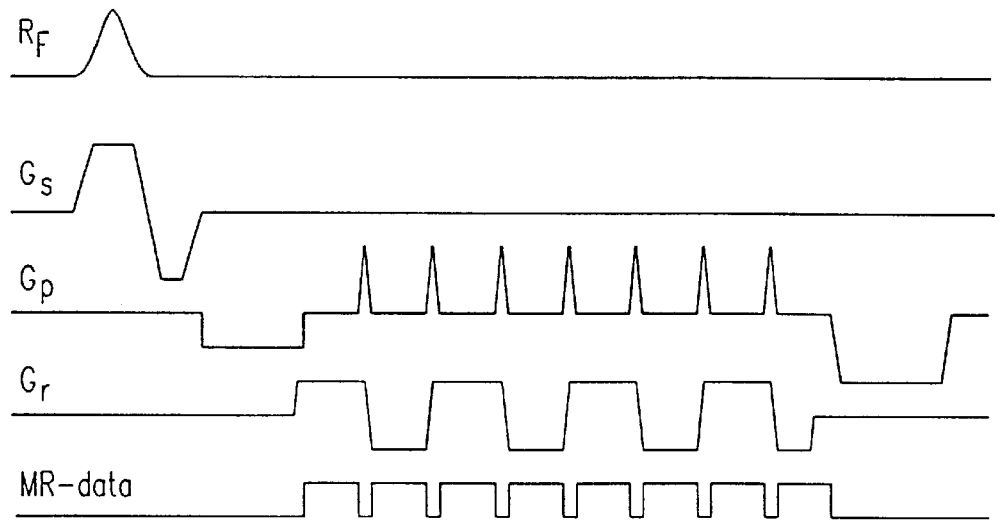
FIG. 5 shows the variation in time of various signals in a sequence for flux visualization.

Referring to FIG. 5, the visualization of the flow of a liquid substance in the examination zone, for example blood or a contrast medium, by means of such microcoils will now be described. The first line of FIG. 5 shows an RF pulse $R_f$ and the second, the third and the fourth line show the temporal variation of the magnetic gradient fields $G_s$ for the slice selection, $G_p$ for the phase encoding and $G_r$ for the reading out of the MR signals. The fifth line shows the instants at which MR signals are acquired in this sequence of the EPI type.

First a slice containing the microcoil 6 is excited by means of the RF pulse and the slice selection gradient $G_s$. As a result, the nuclear magnetization is excited in the blood or the contrast medium volume situated in the direct vicinity of the microcoil at the instant of excitation. A nuclear magnetization pattern which is clearly distinct from that in its vicinity is impressed on this blood or contrast medium volume, so that the flow of the previously excited volume can be tracked on the basis of the propagation of this pattern. Because only a strictly local area has to be measured, this area can be measured in the so-called k-space with a comparatively small number of sample points, thus enabling the use of very fast MR sequences such as the EPI method which is shown in the drawing and includes only a single excitation pulse.

Subsequent to the slice-selective RF pulse the phase encoding gradient is switched on and off in such a manner that the maximum phase encoding is reached in the k-space. Subsequently, a read-out gradient $G_r$ with a continuously alternating polarity is switched on, each polarity reversal being accompanied by a brief "blip" of the phase encoding gradient $G_p$, so that subsequent thereto a neighboring line in the k-space is scanned and each time a respective MR signal is acquired. After the last polarity reversal, the phase encoding gradient is activated with a polarity which opposes that of the blips and with a time integral such that in the k-space the same point is reached as before the start of the sequence.

Subsequently, the phase encoding and read-out operations are repeated at given time intervals, but without a new RF pulse, so that the further propagation of the volume excited by the RF pulse can be tracked. The images thus produced can be superposed on a previously formed survey image or an angiogram.

The temporal distance between the last repeat of the read-out cycle and the RF pulse is limited by the dephasing due to the magnetic field inhomogeneity and the like. In order to reduce such dephasing, it would be possible to generate, after each read-out cycle, an 180° RF pulse which refocuses the nuclear magnetization in the previously excited volume part.

On the other hand, it may also occur that the MR signal of the excited spins is very quickly dephased so that a study on the basis of complete MR images (be it with only few lines in the k-space) is not possible because of the finite measuring time. In that case the sequence could be reduced to the measurement of projections, preferably in the flow direction in which the blood or contrast medium volume propagates. The dynamic behavior of the excited volume could be examined by repeating this measurement at given time intervals, be it without renewed excitation. In the sequence of FIG. 5 it is then necessary merely that the phase encoding gradient is continuously switched off.

Another possibility of tracking the propagation of a continuously flowing liquid (for example, blood) consists in forming a plurality of MR images, each MR image being preceded by an excitation of the nuclear magnetization by a respective RF pulse and the distances in time between the RF pulse and the reading out of the MR signals being varied. In order to ensure comparability, the RF pulse should always be generated in the same phase of the cardiac cycle.

The microcoils can also be used, for example to localize an instrument (for example, a catheter) introduced into the examination zone and provided with one or more microcoils at its tip. When a plurality of microcoils is used, their localization will be substantially simpler than when microcoils are used which are all connected to the MR receiver via a respective connection lead.

For many applications it is not necessary to see the entire anatomy. Usually only a spatially limited area is of interest (for example, biopsies, . . . ). Because the dimensions of the area to be imaged directly influence the measuring time, it is important for fluoroscopy applications to keep the area to be imaged as small as possible. Using the increase of the magnetic field produced in the microcoils, a spatially limited excitation can be achieved by way of a suitable combination of coil size, coil quality factor and flip angle. When very small flip angles (with a high coil quality factor) are selected, it is achieved again that exclusively spins within the coil generate a significant MR signal. Dedicated coils can be used for the reproduction of different areas within the body (for example, stomach, intestines, etc.).

The increase of the external magnetic field, caused by the microcoils, can also be used for hyperthermia; in that case RF pulses of corresponding strength are generated and cause local heating in their direct vicinity due to the increase of the magnetic flux density. The same coil can then also be used to determine the position of the relevant microcoil in an MR image and possibly also for the (MR) measurement of the temperature increase.

All references cited herein are incorporated herein by reference in their entirety and for all purposes to the same extent as if each individual publication or patent or patent application was specifically and individually indicated to be incorporated by reference in its entirety for all purposes.

What is claimed is:

1. An MR method comprising:
    exciting nuclear magnetization in an object to be examined and present in an examination zone by at least one magnetic RF pulse having a central frequency,
    receiving MR signals subsequently by an MR coil,
    forming at least one MR image, and
    introducing at least one microcoil, tuned to the central frequency, into the object to be examined, wherein the microcoil has no connection leads, and wherein the MR signals are processed in such a manner that the local variation, induced by the microcoil, of the magnetic field which occurs in the object to be examined due to the RF pulses becomes visible in the MR image.

2. An MR method as claimed in claim 1, wherein a phase image which represents the spatial distribution of the phase of the nuclear magnetization is generated as the MR image.

3. An MR method as claimed in claim 1, wherein the microcoil comprises a plurality of spatially separated segments of different orientation.

4. An MR method as claimed in claim 1, wherein the microcoil is attached to a medical instrument introduced into the object to be examined.

5. An MR method as claimed in claim 1, wherein each MR image is generated at a temporal distances which differ from said image of each preceding RF pulse in a flow direction in order to facilitate flux visualization.

6. An MR method as claimed in claim 5, wherein a plurality of MR images are generated, each of which represents a respective projection of the nuclear magnetization perpendicular to the flow direction.

7. An MR method as claimed in claim 1, wherein she microcoil introduced into the object serves to excite an object area to be imaged.

8. An MR method as claimed in claim 1, wherein the microcoil is used additionally for the local heating of the object to be examined.

9. An MR device comprising:
a magnet for generating a uniform, steady main magnetic field in an examination zone,
an RF coil system for generating magnetic RF pulses and for receiving MR signals from an object to be examined which is present in the examination zone,
a microcoil having no connection leads and introduced into the object, and
an image reconstruction unit for the reconstruction of MR images, so that the MR signals are processed in such a manner that local variation, induced by the microcoil without connection leads, of the magnetic field which occurs in the object to be examined due to the RF pulses becomes visible in the MR image.

* * * * *